(12) United States Patent
Kuo (10) Patent No.: US 11,705,476 B2
(45) Date of Patent: Jul. 18, 2023

(54) LIGHT EMITTING DEVICE

(71) Applicant: InnoLux Corporation, Miao-Li County (TW)

(72) Inventor: Shu-Ming Kuo, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 98 days.

(21) Appl. No.: 16/953,347

(22) Filed: Nov. 20, 2020

(65) Prior Publication Data

US 2021/0391379 A1 Dec. 16, 2021

(30) Foreign Application Priority Data

Jun. 11, 2020 (CN) .......................... 202010529093.2

(51) Int. Cl.
| | |
|---|---|
| *H01L 27/15* | (2006.01) |
| *H01L 33/22* | (2010.01) |
| *H01L 33/62* | (2010.01) |
| *H01L 33/44* | (2010.01) |
| *H01L 33/12* | (2010.01) |

(52) U.S. Cl.
CPC ............ *H01L 27/156* (2013.01); *H01L 33/12* (2013.01); *H01L 33/22* (2013.01); *H01L 33/44* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 4,857,801 A * | 8/1989 | Farrell ...................... | G09F 9/33 257/89 |
| 11,270,619 B2 * | 3/2022 | Jeong ................... | G09G 3/3233 |
| 2010/0006867 A1 * | 1/2010 | Lee ......................... | H01L 27/15 257/E27.12 |
| 2013/0037827 A1 * | 2/2013 | Levermore ......... | H01L 27/3202 257/40 |
| 2016/0267847 A1 * | 9/2016 | Chen .................... | G09G 3/3225 |
| 2017/0125728 A1 * | 5/2017 | Dighde .............. | H01L 51/5262 |
| 2021/0375979 A1 * | 12/2021 | Cok ........................ | H01L 27/15 |

FOREIGN PATENT DOCUMENTS

CN 109119435 A 1/2019

\* cited by examiner

*Primary Examiner* — Robert K Carpenter
(74) *Attorney, Agent, or Firm* — Winston Hsu (57) ABSTRACT

A light emitting device including a plurality of pixels is provided by the present disclosure. Each of the plurality of pixels includes at least two light emitting diodes, and the at least two light emitting didoes are electrically connected with each other in series, wherein the at least two light emitting diodes have peak external quantum efficiencies under different currents.

20 Claims, 5 Drawing Sheets

LIGHT EMITTING DEVICE

BACKGROUND OF THE DISCLOSURE

1. Field of the Disclosure

The present disclosure relates to a light emitting device, and more particularly to a light emitting device having mixed light emitting diode units.

2. Description of the Prior Art

In recent years, light emitting diode elements are often used in light emitting devices or display devices due to their advantages of low power consumption, high brightness and long lifespan. In general, the light emitting diode elements with the same structure or under the same process conditions may have greater efficiency in the same current range. However, because the user's demands for various kinds of designs of the display device are increased, to improve the efficiency of light emitting diode components under different operating conditions is the direction of development in related fields.

SUMMARY OF THE DISCLOSURE

A light emitting device is provided by the present disclosure, wherein each of the pixels in the light emitting device may include at least two light emitting regions having different characteristics. Because the light emitting device may include light emitting regions with different characteristics, certain efficiency may be maintained in a wider current range, thereby meeting the characteristic requirements of the display device under different gray levels.

According to some embodiments, a light emitting device is provided by the present disclosure. The light emitting device includes a plurality of pixels, each of the pixels includes at least two light emitting didoes, and the at least two light emitting diodes may be electrically connected with each other in series, wherein the at least two light emitting diodes have peak external quantum efficiency under different currents.

According to some embodiments, a light emitting device is provided by the present disclosure. The light emitting device includes a plurality of pixels, each of the pixels includes at least two light emitting didoes, and the at least two light emitting diodes may be electrically connected with each other in series, wherein in each of the plurality of pixels, the at least two light emitting diodes have different current densities when the light emitting device is in an operating state.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include" and "comprise" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
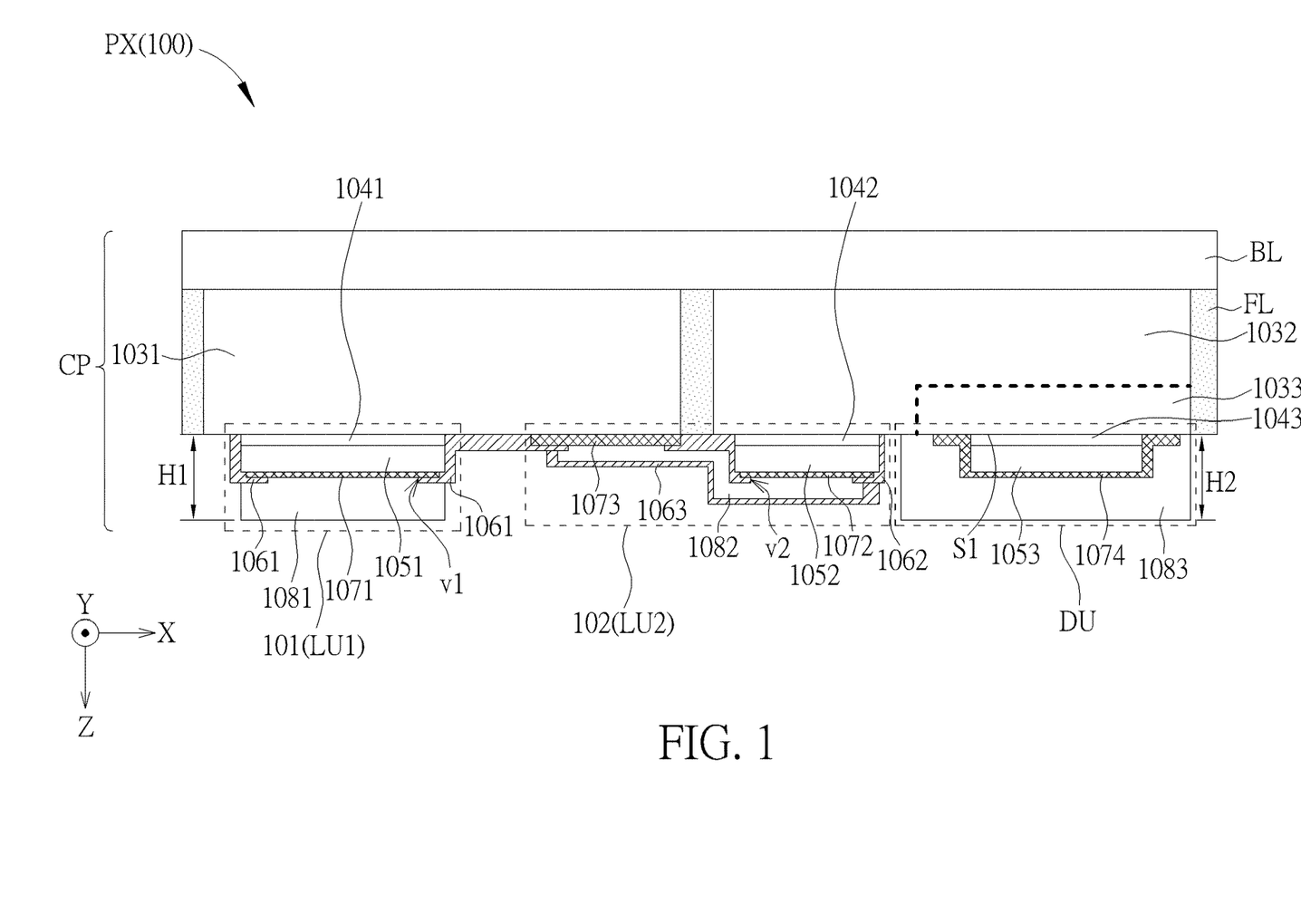
FIG. 1 schematically illustrates a cross-sectional view of a light emitting device according to a first embodiment of the present disclosure.

Referring to FIG. 1, FIG. 1 schematically illustrates a cross-sectional view of a light emitting device according to a first embodiment of the present disclosure. The light emitting device of the present disclosure may include a plurality of pixels or sub-pixels (will be presented as pixels in the following, but the present disclosure is not limited thereto), and in order to simplify the figure, the structure shown in FIG. 1 is one of the plurality of pixels in the light emitting device, and the light emitting device may include a plurality of pixel structures approximately the same as or similar to the pixel structure shown in FIG. 1 and arranged side by side to form a pixel array, but the present disclosure is not limited thereto. The pixel structures included in the light emitting device may not be completely the same or may be pixel structures with different designs. According to the present embodiment, as shown in FIG. 1, the light emitting device 100 may include a plurality of pixels PX, wherein each of the pixels PX may include at least two light emitting units. For example, each of the pixels PX in the light emitting device 100 shown in FIG. 1 may for example include a light emitting unit LU1 and a light emitting unit LU2, but not limited thereto. In some embodiments, the pixel PX may include more light emitting units according to the demands of design of the light emitting device. In the present embodiment, the light emitting unit LU1 and the light emitting unit LU2 may include light emitting diode (LED), that is, each of the pixels PX may include at least two light emitting diodes, but not limited thereto. The light emitting diode may for example include mini LED, micro LED, organic LED (OLED), quantum dot LED (QD-LED) or the combination of the above-mentioned materials. In an embodiment, the chip size of the LED may range from 300 micrometers (μm) to 10 millimeters (mm), the chip size of the mini LED may range from 100 μm to 300 μm, and the chip size of the micro LED may range from 1 μm to 100 μm, but not limited thereto. In each of the embodiments in the following, a first light emitting diode 101 and a second light emitting diode 102 are respectively taken as an example of the light emitting unit LU1 and the light emitting unit LU2, but the present disclosure is not limited thereto. As shown in FIG. 1, the first light emitting diode 101 and the second light emitting diode 102 may be located in the same light emitting diode chip CP in the present embodiment. That is, each of the pixels PX of the light emitting device 100 may for example include a light emitting diode chip CP, wherein the light emitting diode chip CP may include the first light emitting diode 101 and the second light emitting diode 102, but not limited thereto. According to the present embodiment, as shown in FIG. 1, the first light emitting diode 101 may include a first semiconductor layer 1031, an first active layer 1041 and a second semiconductor layer 1051, wherein the first active layer 1041 is disposed between the first semiconductor layer 1031 and the second semiconductor layer 1051, and the second light emitting diode 102 may include a first semiconductor layer 1032, an second active layer 1042 and a second semiconductor layer 1052, wherein the second active layer 1042 is disposed between the first semiconductor layer 1032 and the second semiconductor layer 1052. According to the present embodiment, the first semiconductor layer 1031 and the first semiconductor layer 1032 may for example be an n type semiconductor layer, and may for example include gallium nitride (GaN), other suitable materials or the combinations of the above-mentioned materials; the second semiconductor layer 1051 and the second semiconductor layer 1052 may for example be a p type semiconductor layer, and may for example include gallium nitride, other suitable materials or the combinations of the above-mentioned materials, but not limited thereto. The first active layer 1041 and the second active layer 1042 may for example include multiple quantum well (MQW) structures, wherein the first active layer 1041 and the second active layer 1042 may respectively define the light emitting region of the first light emitting diode 101 and the light emitting region of the second light emitting diode 102, but not limited thereto. Specifically, the area of the first active layer 1041 and the area of the second active layer 1042 may be defined as the area of the light emitting region of the first light emitting diode 101 and the area of the light emitting region of the second light emitting diode 102 in a single pixel PX of the present embodiment, wherein the area of the first active layer 1041 and the area of the second active layer 1042 may represent the area of the first active layer 1041 and the area of the second active layer 1042 on a X-Y plane shown in FIG. 1, but not limited thereto. The definition of the light emitting region of the first light emitting diode 101 and the light emitting region of the second light emitting diode 102 mentioned above may be applied to each of the embodiments in the present disclosure, and will not be redundantly described in the following.

In addition to the above-mentioned elements and layers, the first light emitting diode 101 of the light emitting device 100 may further include a transparent conductive layer 1071, a passivation layer 1061 and a bonding pad 1081, and the second light emitting diode 102 of the light emitting device 100 may further include a transparent conductive layer 1072, a passivation layer 1062 and a bonding pad 1082, but not limited thereto. According to the present embodiment, as shown in FIG. 1, the transparent conductive layer 1071 and the transparent conductive layer 1072 may respectively be disposed on the second semiconductor layer 1051 and the second semiconductor layer 1052 in a direction Z, and the transparent conductive layer 1071 and the transparent conductive layer 1072 may respectively be in contact with the second semiconductor layer 1051 and the second semiconductor layer 1052, but not limited thereto. The material of the transparent conductive layer 1071 and the transparent conductive layer 1072 may for example include indium tin oxide (ITO), other transparent conductive materials or the combinations of the above-mentioned materials, wherein the transparent conductive layer 1071 and the transparent conductive layer 1072 may for example serve as the ohm contact layer, such that the current passing through the transparent conductive layer 1071 and the transparent conductive layer 1072 may respectively be diffused evenly to the second semiconductor layer 1051 and the second semiconductor layer 1052, thereby improving the performance of the first light emitting diode 101 and the second light emitting diode 102, but not limited thereto. Specifically, since the energy gap difference between the second semiconductor layer 1051 and the bonding pad 1081 and the energy gap difference between the second semiconductor layer 1052 and the bonding pad 1082 are greater, the transparent conductive layer 1071 and the transparent conductive layer 1072 with an energy gap between them may serve as the ohm contact layer, such that the current may flow to the second semiconductor layer 1051 and the second semiconductor layer 1052 after being diffused evenly in the transparent conductive layer 1071 and the transparent conductive layer 1072, but not limited thereto. According to the present embodiment, a passivation layer 1061 may be disposed at the outside (such as the surface of the sidewall) of the first active layer 1041, the second semiconductor layer 1051 and the transparent conductive layer 1071, and may further be disposed between the transparent conductive layer 1071 and the bonding pad 1081. Specifically, at least a portion of the passivation layer 1061 may be located between the transparent conductive layer 1071 and the bonding pad 1081 in the direction Z. Similarly, a passivation layer 1062 may be disposed at the outside (such as the surface of the sidewall) of the second active layer 1042, the second semiconductor layer 1052 and the transparent conductive layer 1072, and may further be disposed between the transparent conductive layer 1072 and the bonding pad 1082. Specifically, at least a portion of the passivation layer 1062 may be located between the transparent conductive layer 1072 and the bonding pad 1082 in the direction Z, but not limited thereto. The passivation layer 1061 and the passivation layer 1062 may for example reduce the influence of moisture on the first light emitting diode 101 and the second light emitting diode 102 respectively to improve the light emitting performance of the first light emitting diode 101 and the second light emitting diode 102. The passivation layer 1061 and the passivation layer 1062 may for example include silicon oxide, other suitable materials or the combinations of the above-mentioned materials, but not limited thereto. In the present embodiment, the passivation layer 1061 may include a via v1, and the passivation layer 1062 may include a via v2, wherein the via v1 may expose a portion of the transparent conductive layer 1071 in a direction opposite to the direction Z, and the via v2 may expose a portion of the transparent conductive layer 1072 in a direction opposite to the direction Z, but not limited thereto. The bonding pad 1081 and the bonding pad 1082 may respectively be disposed on the transparent conductive layer 1071 and the transparent conductive layer 1072 in the direction Z. Specifically, the bonding pad 1081 may for example be filled into the via v1 and be in contact with the transparent conductive layer 1071 through the via v1, and the bonding pad 1082 may for example be filled into the via v2 and be in contact with the transparent conductive layer 1072 through the via v2. According to the present embodiment, as shown in FIG. 1, the bonding pad 1081 may be electrically connected with the second semiconductor layer 1051 of the first light emitting diode 101 through the transparent conductive layer 1071, wherein the bonding pad 1081 may for example serve as the bonding pad or the anode of the first light emitting diode 101 in the present embodiment. In addition, according to the present embodiment, one end of the bonding pad 1082 may be electrically connected with the second semiconductor layer 1052 of the second light emitting diode 102 through the transparent conductive layer 1072, and the other end of the bonding pad 1082 may be electrically connected with the first semiconductor layer 1031 of the first light emitting diode 101 through a transparent conductive layer 1073, wherein the material of the transparent conductive layer 1073 may refer to the material of the transparent conductive layer 1071 and the transparent conductive layer 1072, and will not be redundantly described. Since the first semiconductor layer 1031 and the first semiconductor layer 1032 are n type semiconductor layers, and the second semiconductor layer 1051 and the second semiconductor layer 1052 are p type semiconductor layers in the present embodiment, it can be seen from FIG. 1 that the two light emitting units (the first light emitting diode 101 and the second light emitting diode 102) of the light emitting device 100 may be electrically connected with each other in series through the bonding pad 1082. In detail, one end of the bonding pad 1082 may be electrically connected with the p type semiconductor layer (the second semiconductor layer 1052) of the second light emitting diode 102, and the other end of the bonding pad 1082 may be electrically connected with the n type semiconductor layer (the first semiconductor layer 1031) of the first light emitting diode 101, such that the first light emitting diode 101 may be electrically connected with the second light emitting diode 102 in series, but not limited thereto. Furthermore, the transparent conductive layer 1073 located between the bonding pad 1082 and the first semiconductor layer 1031 may serve as the ohm contact layer to reduce the energy gap difference between the bonding pad 1082 and the first semiconductor layer 1031 when it is conducted, such that the current passing through the transparent conductive layer 1073 may be diffused evenly to the first semiconductor layer 1031. In addition, the structure of a single pixel PX of the light emitting device 100 may further include a passivation layer 1063 covering the surface of the bonding pad 1082 to reduce the influence of moisture on the bonding pad 1082 in the present embodiment, wherein the material of the passivation layer 1063 may refer to the material of the passivation layer 1061 and the passivation layer 1062 mentioned above, and will not be redundantly described here. It should be noted that although FIG. 1 only shows the connection of two light emitting units, the present disclosure is not limited thereto. In some embodiments, when the structure of a single pixel PX of the light emitting device 100 includes more than two light emitting units, a light emitting unit and another light emitting unit may also form a series structure through the bonding pad 1082 and the transparent conductive layer 1073 shown in FIG. 1, but not limited thereto.

In the present embodiment, the structure of a single pixel PX of the light emitting device 100 may further include a dummy light emitting unit DU in addition to the above-mentioned elements or layers, wherein the dummy light emitting unit DU may for example include a first semiconductor layer 1033, an active layer 1043, a second semiconductor layer 1053, a transparent conductive layer 1074 and a bonding pad 1083. The materials of each of the layers or elements of the dummy light emitting unit DU may be the materials of the corresponding elements or layers of the first light emitting diode 101 and the second light emitting diode 102, and will not be redundantly described here. The first semiconductor layer 1033 of the dummy light emitting unit DU may be connected with the first semiconductor layer 1032 of the second light emitting diode 102, or it can be said that the first semiconductor layer 1033 is included in the first semiconductor layer 1032 or the first semiconductor layer 1033 may be regarded as a portion of the first semiconductor layer 1032. In a variant embodiment, it can also be regarded that the first semiconductor layer 1033 of the dummy light emitting unit DU and the first semiconductor layer 1032 of the dummy light emitting unit DU of the second light emitting diode 102 are formed of the same semiconductor layer, or the first semiconductor layer 1033 and the first semiconductor layer 1032 may be overlapped with each other. According to the present embodiment, because the bonding pad 1083 is in contact with the surface of the first semiconductor layer 1033 and is electrically connected with the first semiconductor layer 1032 and the first semiconductor layer 1033, the bonding pad 1083 may for example serve as a bonding pad of the first semiconductor layer 1032 (or the n type semiconductor layer) in the present embodiment. It can be seen from the above-mentioned contents that the structure of a single pixel PX of the light emitting device 100 of the present invention may include two light emitting units electrically connected with each other in series, wherein the bonding pad 1083 may for example serve as the bonding pad of the n type semiconductor layer of the two light emitting units connected in series (or it can be called as a cathode contact of the light emitting unit), and the bonding pad 1081 may serve as the bonding pad of the p type semiconductor layer (or it can be called as a anode contact of the light emitting unit). Therefore, when the light emitting device 100 is in operation, the current passing through the bonding pad 1081 and/or the bonding pad 1083 may pass through the first light emitting diode 101 and the second light emitting diode 102 connected in series, such that the first light emitting diode 101 and the second light emitting diode 102 may emit light together, but not limited thereto. According to the present embodiment, when the first active layer 1041, the second semiconductor layer 1051 and the transparent conductive layer 1071 of the first light emitting diode 101 and/or the second active layer 1042, the second semiconductor layer 1052 and the transparent conductive layer 1072 of the second light emitting diode 102 are formed, the active layer 1043, the second semiconductor layer 1053 and the transparent conductive layer 1074 of the dummy light emitting unit DU may be formed simultaneously. Therefore, the transparent conductive layer 1071 and the transparent conductive layer 1074 may be on the same horizontal plane, and the bonding pad 1083 may be formed when the bonding pad 1081 is formed in the present embodiment. The processes and structural designs mentioned above may make the height of the bonding pad 1081 approximately the same as the height of the bonding pad 1083. In detail, as shown in FIG. 1, a height H1 of the bonding pad 1081 from the surface S1 of the first semiconductor layer 1031 and the first semiconductor layer 1032 and a height H2 of the bonding pad 1083 from the surface S1 may be the same, but not limited thereto. Because the bonding pad 1081 and the bonding pad 1083 may respectively serve as the bonding pad of the p type semiconductor layer and the bonding pad of the n type semiconductor layer in the present embodiment, the bonding pad 1081 and the bonding pad 1083 having the same height may reduce the difficulty and error of connection when the light emitting device 100 is connected with external electronic components, but not limited thereto. It should be noted that since the p-n junction of the dummy light emitting unit DU is in a short circuit state, as shown in FIG. 1, the dummy light emitting unit DU does not provide light emitting function in the present embodiment, and the dummy light emitting unit DU is configured to make the height of the bonding pad 1083 approximately the same as the height of the bonding pad 1081, so as to serve as a connection pad or provide the function of conduction, but not limited thereto.

In addition to the above-mentioned elements and layers, a single pixel PX of the light emitting device 100 may optionally include a filling material FL and a buffer layer BL. According to the present embodiment, the filling material FL may for example include polymethyl methacrylate (PMMA), other suitable materials or the combinations of the above-mentioned materials, but not limited thereto. The filling material FL may for example serve as the supporting structure in the present embodiment, but not limited thereto. According to the present embodiment, the filling material FL may be disposed to separate a semiconductor layer of a light emitting diode and a semiconductor layer of another light emitting diode. For example, as shown in FIG. 1, the filling material FL may separate the first semiconductor layer 1031 of the first light emitting diode 101 and the first semiconductor layer 1032 of the second light emitting diode 102, but not limited thereto. The buffer layer BL may for example include gallium nitride, other suitable materials or the combinations of the above-mentioned materials, but not limited thereto. The first light emitting diode 101 and the second light emitting diode 102 may be disposed on a side of the buffer layer BL in the present embodiment. The buffer layer BL may for example be disposed on a substrate (not shown in FIG. 1) at first, so as to facilitate the subsequent epitaxial process for forming the light emitting device 100, but not limited thereto. When the thickness of the buffer layer BL is too thin, the buffering effect provided by the buffer layer BL may be reduced. When the thickness of the buffer layer BL is too large, lattice defects may occur in the structure of the first light emitting diode 101 and the structure of the second light emitting diode 102. Therefore, according to the present embodiment, the thickness (thickness in the direction Z) of the buffer layer BL may range from 0.5 micrometers (μm) to 5 μm, but not limited thereto. It should be noted that the size and thickness of each of the elements or layers of the structure shown in FIG. 1 are only exemplary; the present disclosure is not limited thereto. The designs of the first light emitting diode 101 and the second light emitting diode 102 in a single pixel PX and the manufacturing processes of the light emitting device 100 will be detailed in the following contents.

Figure 2:
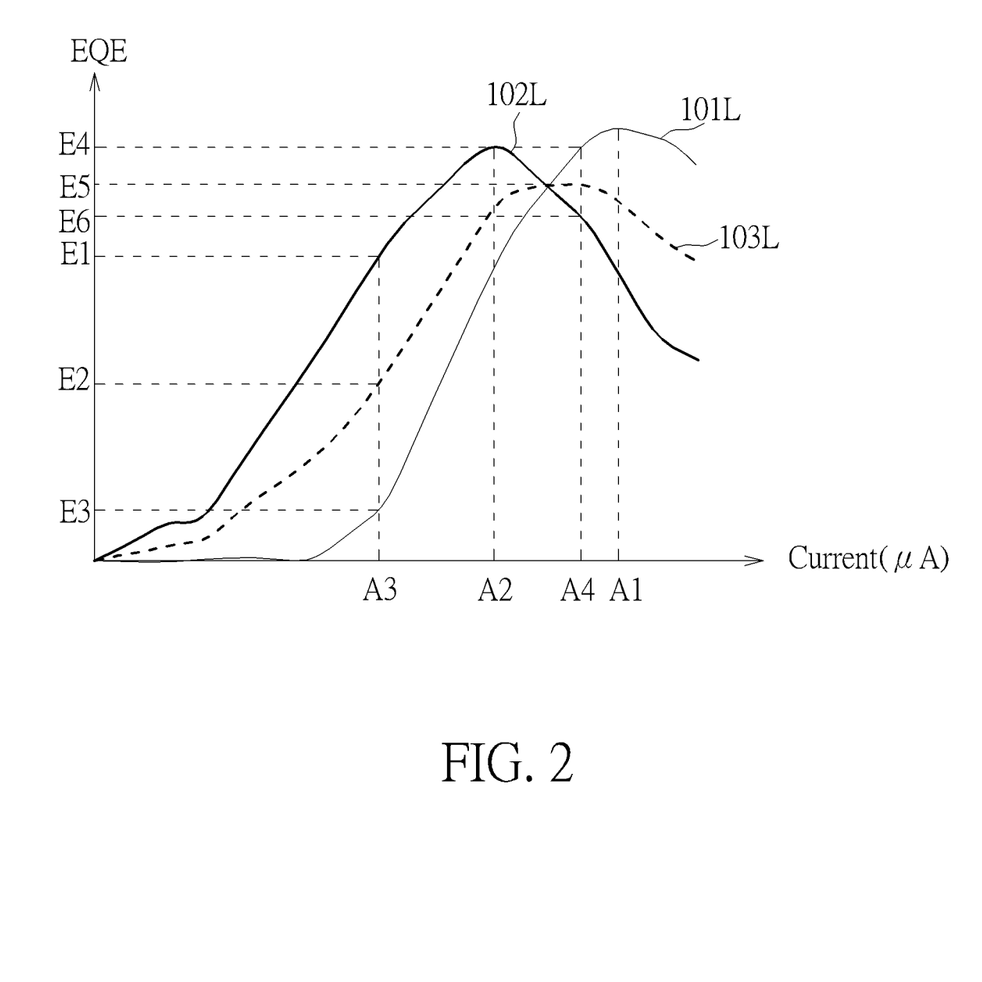
FIG. 2 schematically illustrates an external quantum efficiency of a light emitting region of the light emitting device under different currents according to the first embodiment of the present disclosure.
Figure 3:
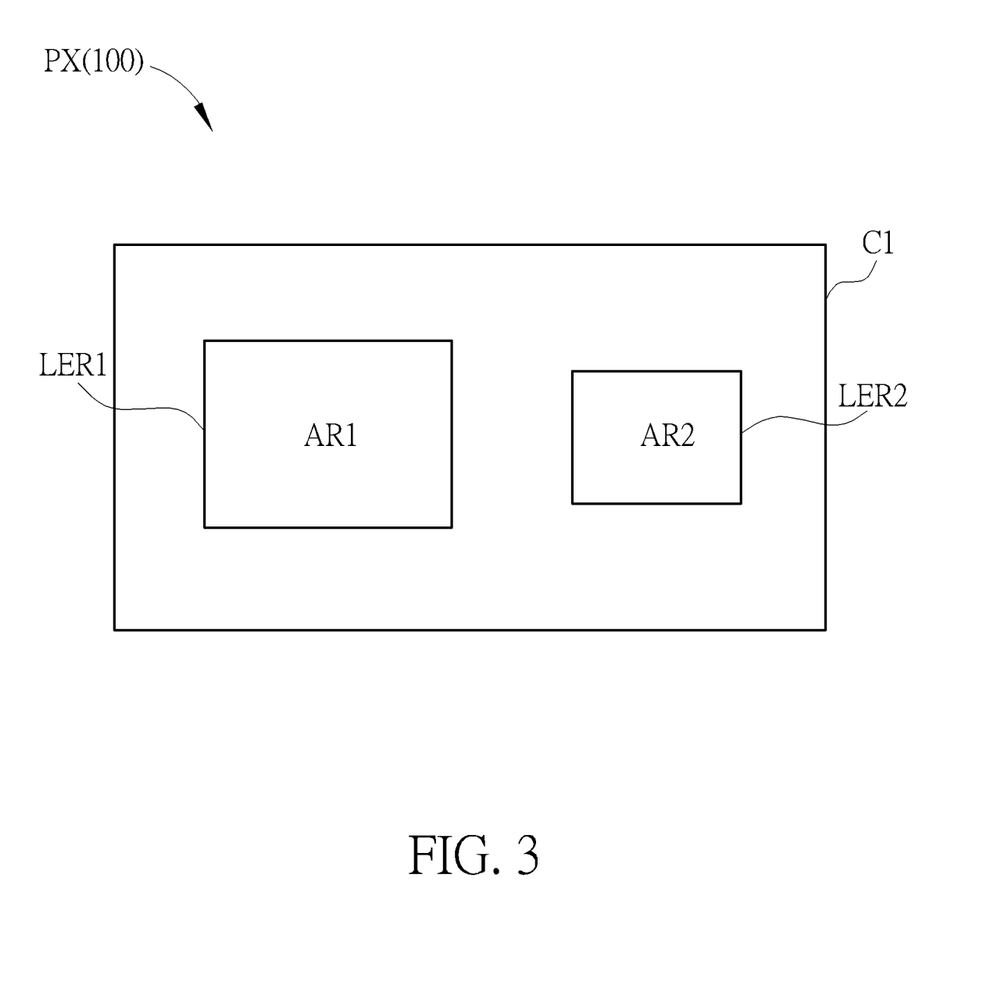
FIG. 3 schematically illustrates a top view of the light emitting region of the light emitting device according to the first embodiment of the present disclosure.

Referring to FIG. 2 and FIG. 3, as well as FIG. 1, FIG. 2 schematically illustrates an external quantum efficiency of a light emitting region of the light emitting device under different currents according to the first embodiment of the present disclosure, and FIG. 3 schematically illustrates a top view of the light emitting region of the light emitting device according to the first embodiment of the present disclosure. In order to simplify the figure, the light emitting regions of the first light emitting diode and the second light emitting diode in a single pixel PX are exemplarily shown in FIG. 3, and other elements and layers are omitted in FIG. 3. According to the present embodiment, the first light emitting diode 101 and the second light emitting diode 102 in the same pixel PX may have different peak external quantum efficiencies (EQE) under different currents. In other words, the peak external quantum efficiency of the first light emitting diode 101 and the peak external quantum efficiency of the second light emitting diode 102 may occur in different operating currents, but not limited thereto. External quantum efficiency may represent the light emitting efficiency of the light emitting unit, wherein the light emitting unit may have better light emitting efficiency when the external quantum efficiency of the light emitting unit is greater. For example, as shown in FIG. 2, the relationship between external quantum efficiency of the first light emitting diode 101 and the current can be represented by a curve 101L, and the relationship between external quantum efficiency of the second light emitting diode 102 and the current can be represented by a curve 102L, wherein the peak external quantum efficiency of the first light emitting diode 101 may correspond to a current A1, the peak external quantum efficiency of the second light emitting diode 102 may correspond to a current A2, and the current A1 is different from the current A2, but not limited thereto. In the present embodiment, the peak external quantum efficiency of the first light emitting diode 101 and the peak external quantum efficiency of the second light emitting diode 102 occurred in different operating currents may for example be achieved by controlling the structure of the light emitting unit. For example, when the area of the light emitting region of the light emitting unit is greater, the peak external quantum efficiency thereof may correspond to a greater current, but not limited thereto. For example, as shown in FIG. 3, the light emitting diode 101 may include a light emitting region LER1, and the light emitting diode 102 may include a light emitting region LER2 in the present embodiment, wherein the light emitting region LER1 may have an area AR1, and the light emitting region LER2 may have an area AR2. Therefore, the structures of the first light emitting diode 101 and the second light emitting diode 102 may be designed to make the area AR1 greater than the area AR2, thereby making the peak external quantum efficiency of the first light emitting diode 101 having the light emitting region with greater area correspond to a greater current (as shown in FIG. 2). In the present embodiment, controlling the area of the light emitting region of the light emitting diode element may for example be achieved by controlling the areas of some of the elements or the layers of the structure. For example, as shown in FIG. 1, the area of the first active layer 1041 of the first light emitting diode 101 may be greater than the area of the second active layer 1042 of the second light emitting diode 102, or, the area of the second semiconductor layer 1051 (or the p type semiconductor layer) of the first light emitting diode 101 may be greater than the area of the second semiconductor layer 1052 (or the p type semiconductor layer) of the second light emitting diode 102, but not limited thereto. In detail, as shown in FIG. 1 and FIG. 2, the first light emitting diode 101 and second light emitting diode 102 may be included in a single pixel PX, wherein the area of the p type semiconductor layer of the first light emitting diode 101 may be greater than the area of the p type semiconductor layer of the second light emitting diode 102, and it can be seen from FIG. 2 that the current (such as current A1) corresponding to the peak external quantum efficiency of the first light emitting diode 101 is greater than the current (such as current A2) corresponding to the peak external quantum efficiency of the second light emitting diode 102, but not limited thereto. In the present embodiment, in addition to the structural difference achieved by controlling the area of the p type semiconductor layer of the light emitting diode, the peak external quantum efficiencies of the light emitting diode elements may correspond to different currents through other structural differences. In some embodiments, the area of the transparent conductive layer 1071 of the first light emitting diode 101 may be different from the area of the transparent conductive layer 1072 of the second light emitting diode 102 (for example, the area of the transparent conductive layer 1071 of the first light emitting diode 101 may be greater than the area of the transparent conductive layer 1072 of the second light emitting diode 102), such that the current corresponding to the peak external quantum efficiency of the first light emitting diode 101 may be greater than the current corresponding to the peak external quantum efficiency of the second light emitting diode 102. In addition, in some other embodiments, the size of the via v1 of the passivation layer 1061 of the first light emitting diode 101 may be different from the size of the via v2 of the passivation layer 1062 of the second light emitting diode 102 (for example, the size of the via v1 may be greater than the size of the via v2), such that the current corresponding to the peak external quantum efficiency of the first light emitting diode 101 may be greater than the current corresponding to the peak external quantum efficiency of the second light emitting diode 102. It should be noted that the areas of the light emitting regions, the p type semiconductor layers and the transparent conductive layers mentioned above may be defined as the areas of the planes (such as the X-Y plane) of the elements or the layers parallel to the surface S1 of the first semiconductor layer 1031, and the sizes of the vias mentioned above may be defined as the areas enclosed by the bottommost contour of the vias (including the via v1 and the via v2) in the X-Y plane, but not limited thereto. The definition of the areas of the elements and the layers mentioned above may be applied to each of the embodiments in the present disclosure, and will not be redundantly described in the following. It can be seen from the above-mentioned contents that a single pixel PX of the light emitting device 100 may include at least the first light emitting diode 101 and the second light emitting diode 102 in the present embodiment, wherein the areas of some of the elements or the layers (such as the p type semiconductor layer, the transparent conductive layer or the via of the passivation layer) of the first light emitting diode 101 may be different from the areas of some of the elements or the layers of the second light emitting diode 102, such that the relationship diagram between external quantum efficiency of the first light emitting diode 101 and current may be different from the relationship diagram between external quantum efficiency of the second light emitting diode 102 and current. It should be noted that in the above-mentioned elements or layers of the first light emitting diode 101 and the second light emitting diode 102, the area of one, two or more than two of the elements or the layers of the first light emitting diode 101 may be different from the area of the corresponding one, two or more than two of the elements or the layers of the second light emitting diode 102, such that the peak external quantum efficiencies of the two light emitting diodes may correspond to different currents. According to the present embodiment, when a single pixel PX of the light emitting device 100 includes the first light emitting diode 101 or the second light emitting diode 102 only, because the first light emitting diode 101 includes greater external quantum efficiency under a greater current, the light emitting efficiency of the first light emitting diode 101 may be lower, and the light emitting efficiency of the second light emitting diode 102 may be greater when the operating current is lower. In contrast, because the second light emitting diode 102 includes greater external quantum efficiency under a lower current, the light emitting efficiency of the first light emitting diode 101 may be greater, and the light emitting efficiency of the second light emitting diode 102 may be lower when the operating current is greater. According to the present embodiment, because a single pixel PX of the light emitting device 100 may include the first light emitting diode 101 and the second light emitting diode 102 at the same time, wherein the first light emitting diode 101 and the second light emitting diode 102 may respectively include the peak external quantum efficiencies under a greater current and a lower current, the problem that the light emitting device of the prior art having light emitting diodes with the same single structure can hardly provide high light emitting efficiency under a lower current and a greater current simultaneously may be improved. That is, the light emitting efficiency of the light emitting device of the present embodiment may still have a relatively average light emitting efficiency under different operating currents. In detail, as shown in FIG. 2, the curve 103L shown in FIG. 2 may represent the relationship between external quantum efficiency of the light emitting device 100 of the present embodiment and the current, wherein the curve 103L may for example be drawn by calculating the average of the values of external quantum efficiency of the first light emitting diode 101 and the second light emitting diode 102 under different currents. That is, the external quantum efficiency of the light emitting device 100 under a specific current may be the average of the values of external quantum efficiency of the first light emitting diode 101 and the second light emitting diode 102 under that specific current, but not limited thereto. In addition, as mentioned above, the first light emitting diode 101 and the second light emitting diode 102 may be electrically connected in series through the bonding pad 1082 in the present embodiment. That is, when the light emitting device 100 is in operation, the current passing through the first light emitting diode 101 is approximately the same as the current passing through the second light emitting diode 102. Therefore, as shown in FIG. 2, when the light emitting device 100 is being operated under a lower current A3, because the second light emitting diode 102 has greater external quantum efficiency E1, the external quantum efficiency E2 of the light emitting device 100 may be greater than the external quantum efficiency E3 of the first light emitting diode 101. In addition, when the light emitting device 100 is being operated under a greater current A4, because the first light emitting diode 101 has greater external quantum efficiency E4, the external quantum efficiency E5 of the light emitting device 100 may be greater than the external quantum efficiency E6 of the second light emitting diode 102. That is, because a single pixel PX of the light emitting device 100 of the present embodiment includes two light emitting diodes (or light emitting regions) having different characteristics, a certain light emitting efficiency can be maintained under different operating currents, thereby meeting the characteristic requirements of the display device under different gray levels in the subsequent application to the display equipment, but not limited thereto. In addition, as mentioned above, when the light emitting device 100 of the present embodiment is in operation, the current passing through the first light emitting diode 101 may be approximately the same as the current passing through the second light emitting diode 102. However, because the areas of some of the elements or the layers (such as the p type semiconductor layer, the transparent conductive layer and/or the via of the passivation layer) of the first light emitting diode 101 may be different from the areas of the corresponding elements or layers of the second light emitting diode 102, the first light emitting diode 101 and the second light emitting diode 102 may have different current densities when the light emitting device 100 is in operation in the present embodiment, wherein the current density may for example be defined as the current passing through a unit area of the p type semiconductor layer when the light emitting device 100 is in operation, but not limited thereto. In some embodiments, the current density may be defined as the current passing through a unit area of the transparent conductive layer when the light emitting device 100 is in operation, the present disclosure is not limited thereto. Because the area of the p type semiconductor layer (the second semiconductor layer 1051), the transparent conductive layer 1071 and/or the via v1 of the passivation layer 1061 of the first light emitting diode 101 may be greater than the area of the p type semiconductor layer (the second semiconductor layer 1052), the transparent conductive layer 1072 and/or the via v2 of the passivation layer 1062 of the second light emitting diode 102, and the current passing through the first light emitting diode 101 is approximately the same as the current passing through the second light emitting diode 102 in the present embodiment, the current density of the first light emitting diode 101 may be lower than the current density of the second light emitting diode 102, but not limited thereto.

As mentioned above, the relationship curve between external quantum efficiency of the light emitting diode element and current may be changed by changing the areas of some of the layers or the sizes of vias of the light emitting diode element. However, in addition to the above-mentioned methods, the light emitting diode elements having different characteristics may for example be formed by adjusting the epitaxial growth process. In detail, the structure shown in FIG. 1 may for example be formed by the epitaxial growth process, wherein a substrate (not shown in FIG. 1) is provided, the buffer layer BL is disposed on the substrate, and the first semiconductor layer 1031, the first semiconductor layer 1032, the first active layer 1041, the second active layer 1042, the second semiconductor layer 1051 and the second semiconductor layer 1052 are formed on the buffer layer BL (may for example be formed through metal organic chemical vapor deposition (MOCVD), but not limited thereto). After that, the transparent conductive layer 1071, the transparent conductive layer 1072, the passivation layer 1061, the passivation layer 1062, the bonding pad 1081 and the bonding pad 1082 may for example be formed in sequence to form the structure shown in FIG. 1. It should be noted that the active layer 1043 of the dummy light emitting unit DU shown in FIG. 1 may be formed simultaneously with the first active layer 1041 and the second active layer 1042, the second semiconductor layer 1053 may be formed simultaneously with the second semiconductor layer 1051 and the second semiconductor layer 1052, the transparent conductive layer 1074 may be formed simultaneously with the transparent conductive layer 1071 and the transparent conductive layer 1072, and the bonding pad 1083 may be formed simultaneously with the bonding pad 1081 and the bonding pad 1082, but not limited thereto. In addition, the transparent conductive layer 1073 may for example be formed in any step before forming the passivation layer 1061 and the bonding pad 1082, and the passivation layer 1063 may for example be formed after forming the bonding pad 1083, but not limited thereto. As mentioned above, lattice defects may occur in the structure due to a thick buffer layer, and the light emitting efficiency of the light emitting diode element may be affected. Therefore, the thickness of the buffer layer BL may for example be controlled during the epitaxial growth process in the present embodiment, so as to control the relationship between external quantum efficiency and current. In detail, the thickness of the buffer layer BL may be controlled during the formation of the first light emitting diode 101 and the second light emitting diode 102 of the light emitting device 100, such that the first light emitting diode 101 and the second light emitting diode 102 may include different relationship curves between external quantum efficiency and current. For example, the first light emitting diode 101 and the second light emitting diode 102 may have different light emitting performance by having different thicknesses of the buffer layer BL. As a result, the effect that the first light emitting diode 101 and the second light emitting diode 102 have the peak external quantum efficiencies respectively under a greater current and a lower current may be achieved without changing the structure of the first light emitting diode 101 and the second light emitting diode 102.

As mentioned above, a light emitting device is provided by the present disclosure, wherein a single pixel of the light emitting device may include at least two light emitting diodes (or light emitting regions), and the light emitting diodes may include the peak external quantum efficiencies respectively under a greater current and a lower current due to the differences of the structures or the epitaxial growth processes of the light emitting diodes, such that the decrease of external quantum efficiency (or light emitting efficiency) of the light emitting device under different operating currents may be reduced, thereby improving the characteristic requirements of the display device under different gray levels. More embodiments of the present disclosure will be described in the following, and in order to simplify the description, the same layers or elements in the following embodiments would be labeled with the same symbol, and the features thereof will not be redundantly described. The differences between each of the embodiments will be described in detail in the following contents.

Figure 4:
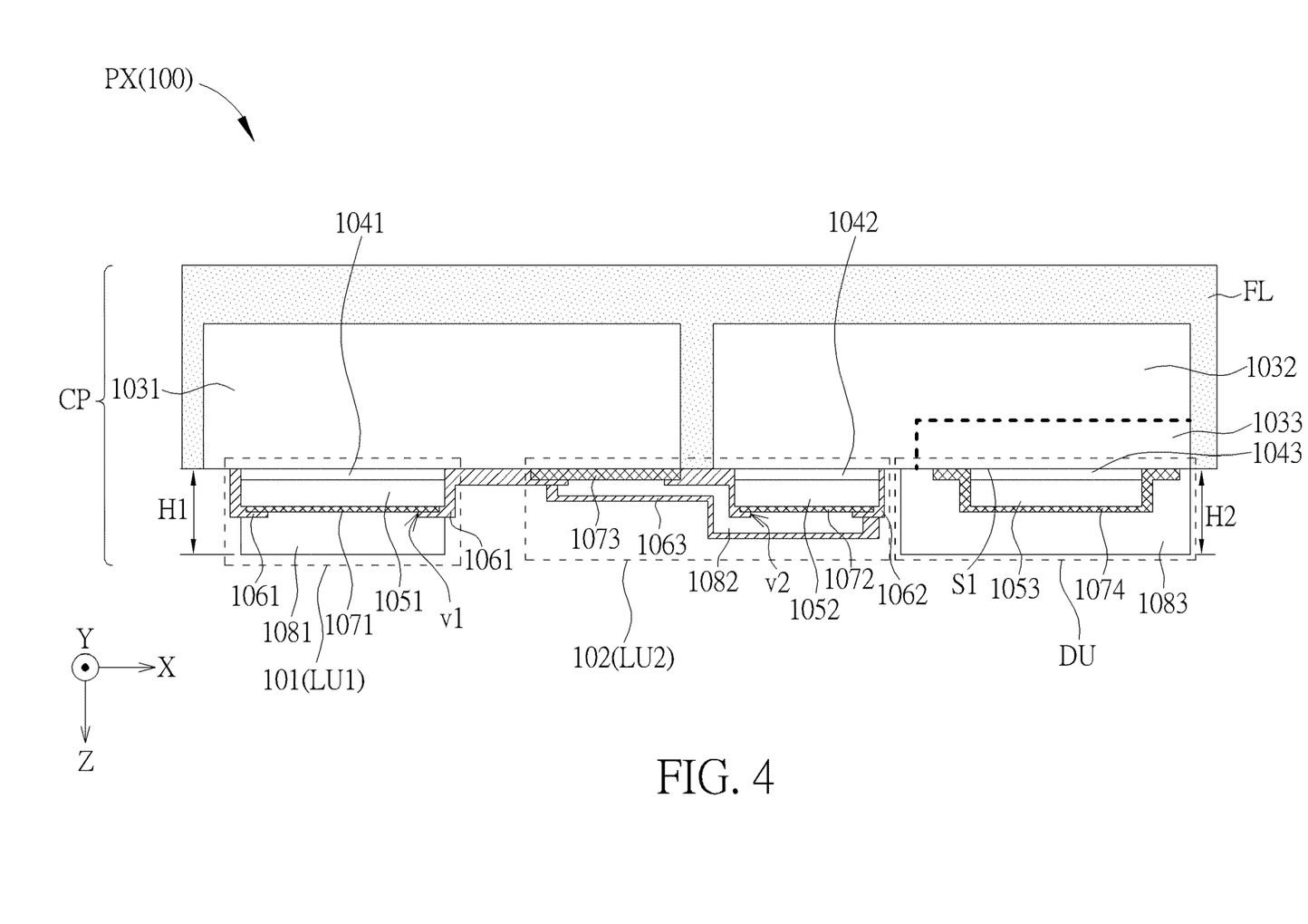
FIG. 4 schematically illustrates a cross-sectional view of a light emitting device according to a second embodiment of the present disclosure.

Referring to FIG. 4, FIG. 4 schematically illustrates a cross-sectional view of a light emitting device according to a second embodiment of the present disclosure. One of the main differences between the structure shown in FIG. 4 and the structure of the first embodiment shown in FIG. 1 is the disposing way of the filling material. As shown in FIG. 4, the buffer layer BL of the light emitting device 100 of the present embodiment may for example be replaced by the filling material FL, but not limited thereto. The materials of the filling material FL and each of the layers or elements of the structure may refer to the contents mentioned above, and will not be redundantly described. In the light emitting device 100 of the present embodiment, the first light emitting diode 101 and the second light emitting diode 102 may include the peak external quantum efficiencies respectively under a greater current and a lower current by the structural differences or other suitable differences of the epitaxial growth processes between the light emitting diode elements, but not limited thereto.

Figure 5:
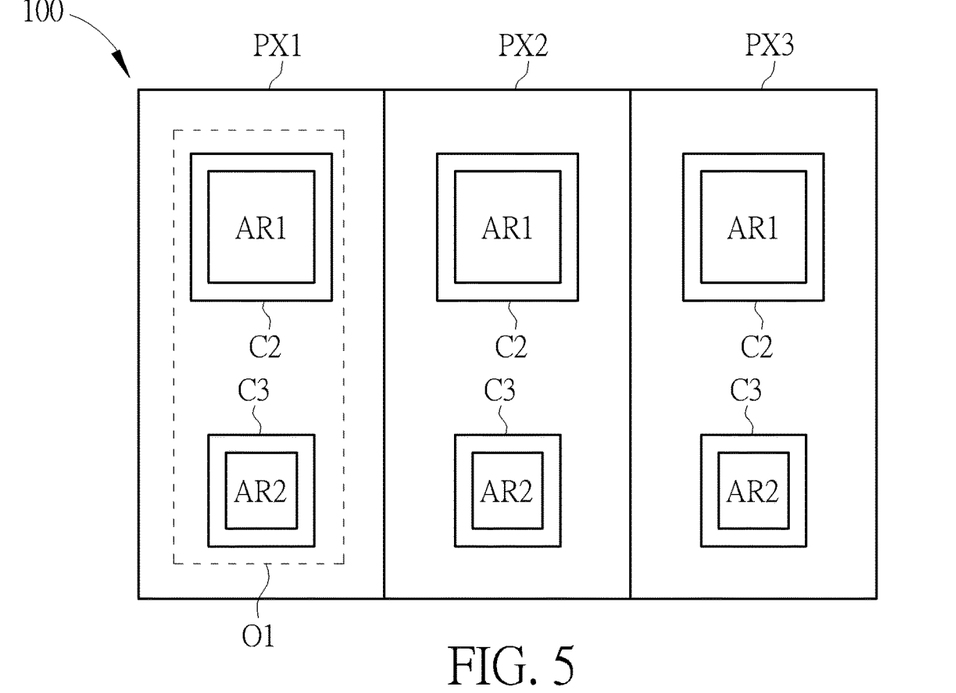
FIG. 5 schematically illustrates a top view of a light emitting region of a light emitting device according to a third embodiment of the present disclosure.
Figure 6:
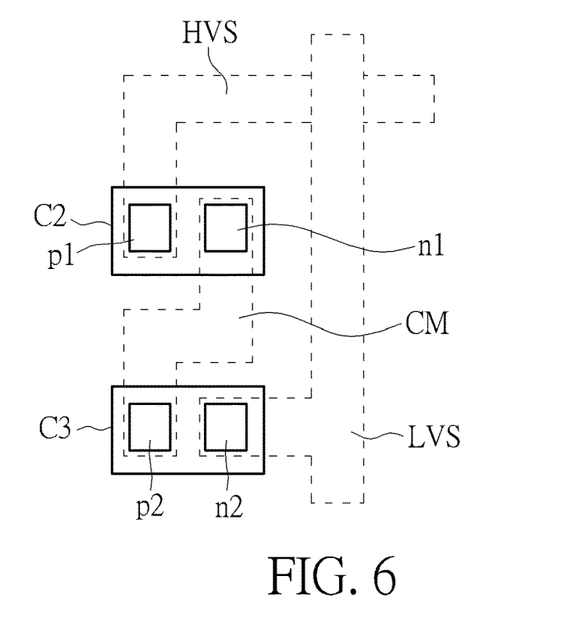
FIG. 6 schematically illustrates a partial enlarged view of a portion O1 shown in FIG. 5.

Referring to FIG. 5 and FIG. 6, FIG. 5 schematically illustrates a top view of a light emitting region of a light emitting device according to a third embodiment of the present disclosure, and FIG. 6 schematically illustrates a partial enlarged view of a portion O1 shown in FIG. 5. In order to simplify the figure, FIG. 5 only exemplarily shows the light emitting regions of the first light emitting diode and the second light emitting diode in the pixel, and other elements and layers are omitted in FIG. 5. In the present embodiment, a light emitting diode chip may include a light emitting diode element, and in order to achieve the goal that at least two light emitting diodes or light emitting regions having different characteristics are included in a single pixel or sub-pixel of the light emitting device 100, a single pixel may for example include at least two light emitting diode chips in the present embodiment, wherein the light emitting diode chips in the same pixel may be electrically connected with each other in series, but not limited thereto. In detail, as shown in FIG. 5, the light emitting device 100 of the present embodiment may for example include a pixel PX1, a pixel PX2 and a pixel PX3, wherein the pixel PX1, the pixel PX2 and the pixel PX3 may for example emit red light, green light and blue light respectively, but not limited thereto. According to the present embodiment, the pixel PX1 may include a light emitting diode chip C2 and a light emitting diode chip C3, wherein the light emitting diode chip C2 may for example include the first light emitting diode 101 shown in FIG. 1, and the light emitting diode chip C3 may for example include the second light emitting diode 102 shown in FIG. 1, but not limited thereto. Therefore, compared with the first embodiment shown in FIG. 3, the first light emitting diode 101 and the second light emitting diode 102 of the present embodiment may respectively be disposed in the light emitting diode chip C2 and the light emitting diode chip C3, and it can be seen from FIG. 3 that the first light emitting diode 101 having the light emitting region LER1 and the second light emitting diode 102 having the light emitting region LER2 may for example be disposed in a light emitting diode chip C1. In addition, as mentioned above, because the area of the light emitting region of the first light emitting diode 101 including the peak external quantum efficiency under a greater current may be greater than the area of the light emitting region of the second light emitting diode 102 including the peak external quantum efficiency under a lower current, the area AR1 may be greater than the area AR2 in FIG. 5, but not limited thereto. In some embodiments, when the first light emitting diode 101 and the second light emitting diode 102 are formed by different epitaxial growth processes, the area AR1 may be equal to the area AR2. It should be noted that the pixel PX2, the pixel PX3 and the pixel PX1 having the same design in FIG. 5 is only an example, and the present disclosure is not limited thereto.

As mentioned above, the light emitting diodes located in the same pixel and disposed in different light emitting diode chips may be electrically connected with each other in series in the present embodiment. FIG. 6 is an enlarged diagram of the portion O1 shown in FIG. 5, wherein FIG. 6 shows a connection method of the light emitting diodes in the same pixel. As shown in FIG. 6, the light emitting diode element (such as the first light emitting diode 101) in the light emitting diode chip C2 may include a first pole p1 and a second pole n1, and the light emitting diode element (such as the second light emitting diode 102) in the light emitting diode chip C3 may include a first pole p2 and a second pole n2, wherein the first pole may for example be the p pole of the light emitting diode element, and the second pole may for example be the n pole of the light emitting diode element in the present embodiment, but not limited thereto. According to the present embodiment, as shown in FIG. 6, the second pole n1 may be connected with the first pole p2 through a connecting material CM, the first pole p1 may be connected with a high voltage source HVS, and the second pole n2 may be connected with a low voltage source LVS, so as to form the series structure of the light emitting diode element in the light emitting diode chip C2 and the light emitting diode element in the light emitting diode chip C3, but not limited thereto. The connecting material CM may include any suitable conductive materials. The light emitting device of the present embodiment can reduce the decrease of external quantum efficiency (or light emitting efficiency) of the light emitting device under different operating currents, thereby improving the characteristic requirements of the display device under different gray levels, wherein the reasons may refer to the above-mentioned contents in the first embodiment, and will not be redundantly described.

In summary, a light emitting device including a plurality of pixels is provided by the present disclosure, wherein each of the pixels may include at least two light emitting diodes or light emitting regions. Because the light emitting diodes in the same pixel may include the peak external quantum efficiencies respectively under a greater current and a lower current due to the differences of the structures or the epitaxial growth processes of the light emitting diodes, the decrease of external quantum efficiency (or light emitting efficiency) of the light emitting device under different operating currents may be reduced, thereby improving the characteristic requirements of the display device under different gray levels.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A light emitting device, comprising:
a plurality of pixels, each of the plurality of pixels comprising at least two light emitting diodes electrically connected with each other in series, the at least two light emitting diodes respectively comprising a first semiconductor layer, an active layer disposed on the first semiconductor layer, a second semiconductor layer disposed on the active layer, and a bonding pad disposed on the second semiconductor layer, wherein the bonding pad of one of the at least two light emitting diodes is overlapped with the first semiconductor layers of both of the at least two light emitting diodes, wherein the at least two light emitting diodes have peak external quantum efficiencies under different currents.

2. The light emitting device of claim 1, wherein the at least two light emitting diodes are formed by different epitaxial growth processes.

3. The light emitting device of claim 1, wherein the second semiconductor layers of the at least two light emitting diodes respectively comprises a p-type semiconductor layer, and the p-type semiconductor layers of the at least two light emitting diodes have different areas.

4. The light emitting device of claim 3, wherein the area of the p-type semiconductor layer of one of the at least two light emitting diodes is greater than the area of the p-type semiconductor layer of another one of the at least two light emitting diodes, and the current corresponding to the peak external quantum efficiency of the one of the at least two light emitting diodes is greater than the current corresponding to the peak external quantum efficiency of the another one of the at least two light emitting diodes.

5. The light emitting device of claim 1, wherein the second semiconductor layers respectively comprises a p-type semiconductor layer, each of the at least two light emitting diodes comprises a transparent conductive layer, the p-type semiconductor layer and the transparent conductive layer in each of the at least two light emitting diodes are in contact with each other, and the transparent conductive layers of the at least two light emitting diodes have different areas.

6. The light emitting device of claim 5, wherein the area of the transparent conductive layer of one of the at least two light emitting diodes is greater than the area of the transparent conductive layer of another one of the at least two light emitting diodes, and the current corresponding to the peak external quantum efficiency of the one of the at least two light emitting diodes is greater than the current corresponding to the peak external quantum efficiency of the another one of the at least two light emitting diodes.

7. The light emitting device of claim 1, wherein each of the at least two light emitting diodes comprises a transparent conductive layer and a passivation layer, the passivation layer is disposed between the transparent conductive layer and the bonding pad in each of the at least two light emitting diodes, wherein the passivation layer has a via and the bonding pad is in contact with the transparent conductive layer through the via, and the vias of the passivation layers of the at least two light emitting diodes have different size.

8. The light emitting device of claim 7, wherein the area of the via of the passivation layer of one of the at least two light emitting diodes is greater than the area of the via of the passivation layer of another one of the at least two light emitting diodes, and the current corresponding to the peak external quantum efficiency of the one of the at least two light emitting diodes is greater than the current corresponding to the peak external quantum efficiency of the another one of the at least two light emitting diodes.

9. The light emitting device of claim 1, further comprising a dummy light emitting unit electrically connected with the at least two light emitting diodes, wherein the dummy light emitting unit comprises an n-type semiconductor layer, an active layer, a p-type semiconductor layer, a transparent layer and a bonding pad.

10. The light emitting device of claim 9, wherein the first semiconductor layers of the at least two light emitting diodes respectively comprises an n-type semiconductor layer, and the n-type semiconductor layer of the dummy light emitting unit is connected to the n-type semiconductor layer of one of the at least two light emitting diodes.

11. The light emitting device of claim 1, further comprising a buffer layer, wherein the at least two light emitting diodes are disposed on a side of the buffer layer, and a thickness of the buffer layer ranges from 0.5 micrometers to 5 micrometers.

12. The light emitting device of claim 1, further comprising a filling material separating a semiconductor layer of one of the at least two light emitting diodes and a semiconductor layer of another one of the at least two light emitting diodes, wherein the filling material comprises polymethyl methacrylate.

13. A light emitting device, comprising:
a plurality of pixels, each of the plurality of pixels comprising at least two light emitting diodes electrically connected with each other in series, the at least two light emitting diodes respectively comprising a first semiconductor layer, an active layer disposed on the first semiconductor layer, a second semiconductor layer disposed on the active layer, and a bonding pad disposed on the second semiconductor layer,
wherein the bonding pad of one of the at least two light emitting diodes is overlapped with the first semiconductor layers of both of the at least two light emitting diodes,
wherein in each of the plurality of pixels, the at least two light emitting diodes have different current densities when the light emitting device is in an operating state.

14. The light emitting device of claim 13, wherein the second semiconductor layers of the at least two light emitting diodes respectively comprises a p-type semiconductor layer, and the p-type semiconductor layers of the at least two light emitting diodes have different areas.

15. The light emitting device of claim 14, wherein the area of the p-type semiconductor layer of one of the at least two light emitting diodes is greater than the area of the p-type semiconductor layer of another one of the at least two light emitting diodes, and the current density of the one of the at least two light emitting diodes is less than the current density of the another one of the at least two light emitting diodes.

16. The light emitting device of claim 13, wherein the second semiconductor layers respectively comprises a p-type semiconductor layer, each of the at least two light emitting diodes comprises a transparent conductive layer, the p-type semiconductor layer and the transparent conductive layer in each of the at least two light emitting diodes are in contact with each other, and the transparent conductive layers of the at least two light emitting diodes have different areas.

17. The light emitting device of claim 16, wherein the area of the transparent conductive layer of one of the at least two light emitting diodes is greater than the area of the transparent conductive layer of another one of the at least two light emitting diodes, and the current density of the one of the at least two light emitting diodes is less than the current density of the another one of the at least two light emitting diodes.

18. The light emitting device of claim 13, wherein each of the at least two light emitting diodes comprises a transparent conductive layer and a passivation layer, the passivation layer is disposed between the transparent conductive layer and the bonding pad in each of the at least two light emitting diodes, wherein the passivation layer has a via and the bonding pad is in contact with the transparent conductive layer through the via, and the vias of the passivation layers of the at least two light emitting diodes have different size.

19. The light emitting device of claim 18, wherein the area of the via of the passivation layer of one of the at least two light emitting diodes is greater than the area of the via of the passivation layer of another one of the at least two light emitting diodes, and the current density of the one of the at least two light emitting diodes is less than the current density of the another one of the at least two light emitting diodes.

20. The light emitting device of claim 13, further comprising a buffer layer, wherein the at least two light emitting diodes are disposed on a side of the buffer layer, and a thickness of the buffer layer ranges from 0.5 micrometers to 5 micrometers.

* * * * *